United States Statutory Invention Registration [19]

[11] Reg. Number: H514

Burnside et al. [43] Published: Aug. 2, 1988

[54] COMPACT RANGE FOR VARIABLE-ZONE MEASUREMENTS

[75] Inventors: Walter D. Burnside; Roger C. Rudduck, both of Columbus, Ohio; Jiunn S. Yu, Albuquerque, N. Mex.

[73] Assignee: The United States of America as represented by the United States Department of Energy, Washington, D.C.

[21] Appl. No.: 19,836

[22] Filed: Feb. 27, 1987

[51] Int. Cl.[4] ..... H01Q 3/00

[52] U.S. Cl. ..... 342/360

[58] Field of Search ..... 342/360, 351

[56] References Cited

U.S. PATENT DOCUMENTS

| | | |
|---|---|---|
| 3,114,910 | 12/1963 | Rymes . |
| 3,165,742 | 1/1965 | Taylor . |
| 3,302,205 | 1/1967 | Johnson . |
| 4,208,661 | 6/1980 | Vokurka . |
| 4,521,780 | 6/1985 | Preikschat . |

OTHER PUBLICATIONS

Liang et al., "Nearzone Backscattering from Finite Cylinders and the Predicted Field Quality of a Compact Range Parabolic Reflector" 12/84.

*Primary Examiner*—Stephen C. Buczinski
*Assistant Examiner*—Linda J. Wallace
*Attorney, Agent, or Firm*—George H. Libman; James H. Chafin; Judson R. Hightower

[57] ABSTRACT

A compact range for testing antennas or radar targets includes a source for directing energy along a feedline toward a parabolic reflector. The reflected wave is a spherical wave with a radius dependent on the distance of the source from the focal point of the reflector.

10 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

COMPACT RANGE FOR VARIABLE-ZONE MEASUREMENTS

The U.S. Government has rights in this invention pursuant to Contract No. DE-AC04-76DP00789 between the U.S. Department of Energy and AT&T Technologies, Inc., a Sandia National Laboratories contract 58-1490 with Ohio State University.

FIELD OF THE INVENTION

The present invention relates to the field of testing antennas and/or radar targets, and more particularly to such testings within a compact range.

BACKGROUND OF THE INVENTION

In the art of testing antennas to determine their radiation patterns, and in testing radar targets for radar backscatter, the device under test is illuminated by planar waves representative of far-field radar signals from a great distance, or spherical waves representative of near-field radar signals close to the target. Both actual far-field ranges and compact ranges which simulate far-field ranges are known. However, in compact range testing, only far-zone testing for simulated large distances is known. For this far-zone testing using compact ranges, the antenna to be tested is placed in a measurement volume in which an illuminating planewave field is generated from a feed antenna or feedhorn having a fixed position at the focal point of a reflector. The test antenna is then rotated in the same way as in a far-field antenna range to obtain its far-zone antenna pattern.

It would be desirable to have a compact range apparatus that provides spherical waves necessary for near-zone measurements. Furthermore, advanced designs in antennas and radar targets require variable-zone tests to evaluate their performance parameters as the distance from radar to target changes. For example, there is presently a need for determining the performance of a tracking radar which is moving in the near-zone of its target. There is also a need for a compact range to study near-zone coupling among antennas in closely spaced antenna systems. Therefore, it would be desirable to provide a compact range apparatus which provides both near-zone measurement and continuously variable measurements from the near-zone to the far-zone.

SUMMARY OF THE INVENTION

Accordingly, it is a primary object of the present invention to provide a compact range apparatus for near-zone measurements for antennas and/or radar targets undergoing evaluation.

It is another object of the invention to provide a compact range apparatus which provides both near-zone and far-zone measurements.

It is a further object of the invention to provide a compact range apparatus which produces smoothly variable spherical waves from the near-zone to the far-zone (i.e., infinity) for the purpose of testing antennas and radar targets.

It is yet another object of the invention to provide a compact range with feed-line angle and feedhorn positions selected to avoid the production of astigmatic waves in the measurement volume.

An additional object of the invention is to provide a compact range that uses a truncated reflector having rolled edges to suppress undesirable diffractions in the measurement volume.

Additional objects, advantages, and novel features of the invention will be set forth in part in the description that follows and in part will become apparent to those skilled in the art upon examination of this disclosure, or may be learned with the practice of the invention. The objects and advantages of the invention may be realized and attained by means of the instrumentalities and combinations particularly pointed out in the appended claims.

To achieve the foregoing and other objects, and in accordance with the purposes of the present invention as described herein, a compact range apparatus for making variable-zone measurements in a measurement volume includes a parabolic reflector fed by a source positioned along an offset feed line extending between the focal point of the reflector and a reflection point on the reflector. A source of sufficiently high frequency to obey the laws of geometrical optics produces the desired spherical waves in the measurement volume. The radius of the spherical waves, or wavefront radius, is a function of the distance of the source from the focal point.

Preferably, the reflector of the compact range apparatus is one-half of the standard parabolic reflector and has elliptically rolled edges. The measurement volume is symmetrically disposed about a wavefront center line parallel to the reflector axis. The source is preferably a feedhorn generating primary waves symmetrically disposed about the offset feed line. The position of the feedhorn on the offset feed line is smoothly adjustable, whereby the radius of curvature of the spherical waves in the measurement volume is continuously variable.

Still other objects of the present invention will become readily apparent to those skilled in this art from the following description, wherein there is shown and described a preferred embodiment of this invention. Simply by way of illustration, the invention will be set forth in part in the description that follows and in part will become apparent to those skilled in the art upon examination of the following or may be learned with the practice of the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION

Figure 1:
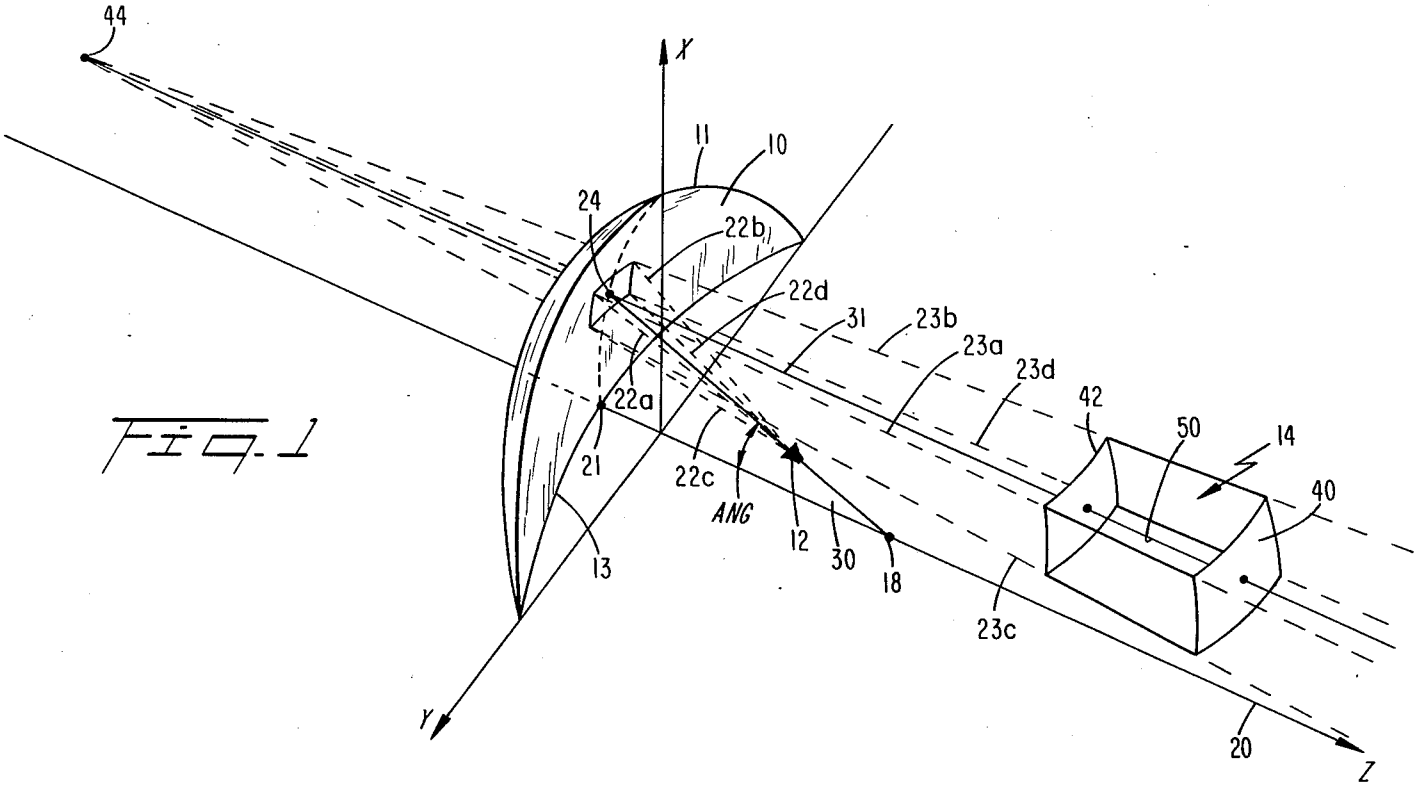
FIG. 1 is a perspective view of the invention.

With reference to the drawings, a preferred embodiment of the variable-zone compact range of the invention includes a parabolic reflector 10, having a focal point 18, and a source 12 such as a feedhorn. The basic principle of the invention is that waves from source 12 symmetrically disposed about a feed line 30 extending from focal point 18 to a reflection point 24 will create spherical waves having a radius extending from a virtual source 44 behind reflector 10 to the center 50 of measurement volume 14. The aforementioned apparatus and measurement volume are preferrably housed in an anechoic chamber 70 of a type well known in the art to prevent unintended signals from entering the measurement volume, and to suppress portions of the reflected beam other than the main reflected beam as described hereinafter.

Figure 2:
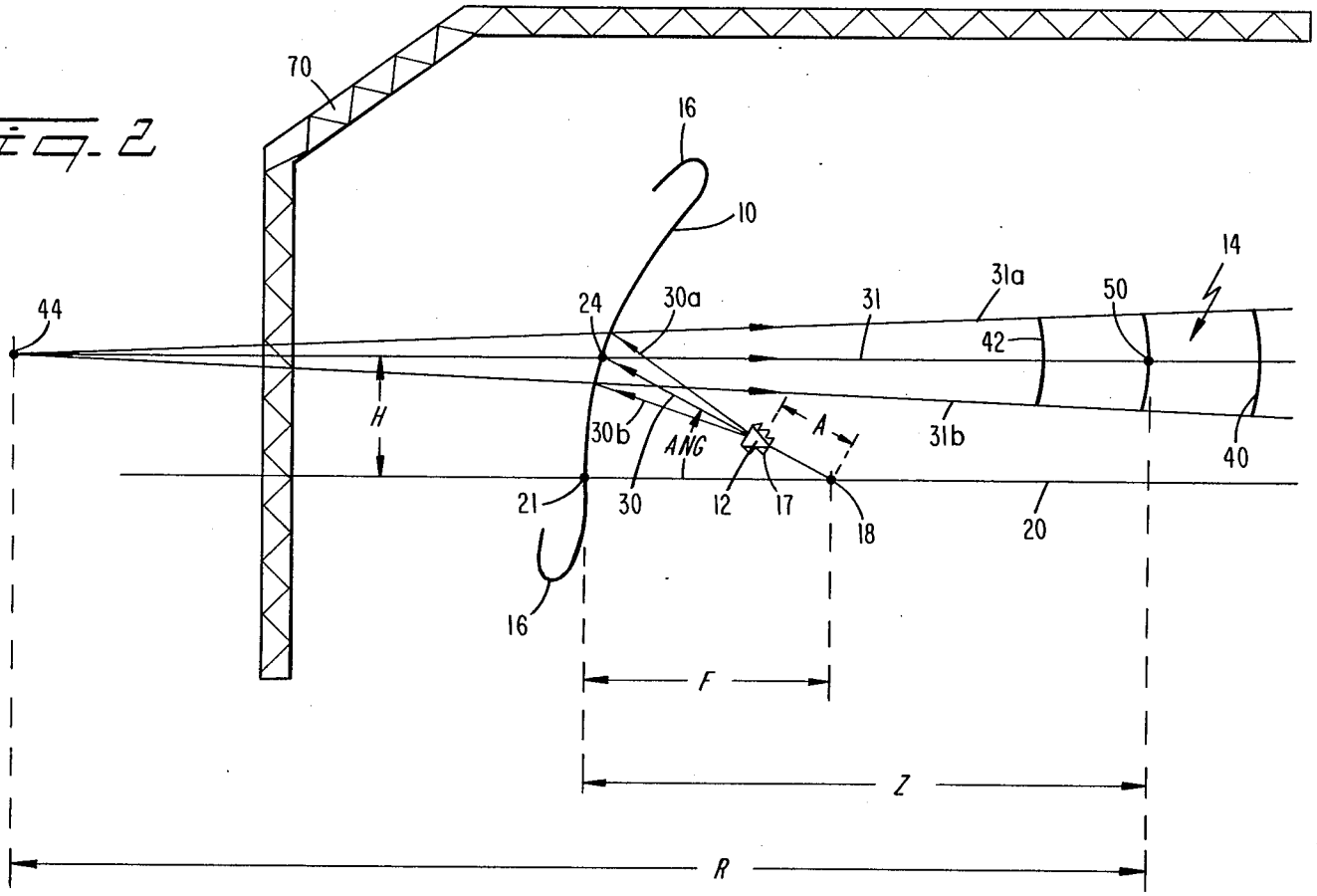
FIG. 2 is a view in the symmetrically disposed xz-plane of FIG. 1.

Feed line 30 extends from focal point 18 to reflection point 24 at an offset angle ANG from reflector axis 20 in the x-z plane symmetrical to reflector 10. Center ray 31 of the reflected beam is parallel to reflector axis 20 and passes through measurement volume center 50. As shown in FIG. 2, such an arrangement keeps source 12 away from the main reflected beam around ray 31. Source 12 is conventionally padded with absorbers 17 to suppress scatterings due to the minor portion of the reflected beam. Source 12 has a preferred beam shape wherein the primary wave illuminates reflector 10 properly for producing desired waves in measurement volume 14, as disclosed herein.

Since source 12 is directed along feed line 30, only a portion of parabolic reflector 10 is used in the invention. The figures show an embodiment using one half of a standard parabolic reflector having a semicircular outer rim 11 in the x-y plane and a bottom rim 13 in the y-z plane. Focal point 18 and feed line 30 are in the x-z plane which bisects reflector 10. Such a construction facilitates the installation of the reflector in an anechoic chamber, as is required for the operation of this invention, because bottom rim 13 can be near the chamber floor, keeping source 12 and measurement volume 14 within relatively convenient reach of operating personnel. However, to minimize the diffraction effects of the rims of the reflector, it has been found that the edges of the reflector should have rolled edges 16 as shown in FIG. 2. These rolled edges are described by W. D. Burnside et. al, IEEE Antennas and Propagation Transactions, February 1987.

As shown in the figures, reflector axis 20 extends from focal point 18 through the point 21 that would be the symmetric center of reflector 10 if the reflector had not been cut in half. The focal point is on the z axis at a location determined by the geometry of the reflector as is well known in the art. Feed line 30 extends from focal point 18 to reflection point 24 at an angle ANG from the reflector axis in the x-z plane. The center ray of the primary beam output of source 12 is directed along feed line 30 and is reflected parallel to axis 20 in the x-z plane as center ray 31 of the reflected beam.

Feedhorn 12 generates the primary waves illustrated as being bounded by the 4 rays **22*a*, 22*b*, 22*c*, and 22*d*, and centered around feed line 30. The output of feedhorn 12** is a signal of sufficiently high frequency (and correspondingly short wavelength) that the reflection obeys the laws of geometrical optics. For a 12 foot radius parabolic reflector, the transmitted frequency is preferably greater than 3 GHz with a wavelength in air less than 10 cm.

It is a well-known property of a parabolic reflector that a ray from the focal point will be reflected along a path parallel to the reflector axis. Accordingly, a ray originating from focal point 18 along feed line 30 will be reflected along center line 31 extending in the x-z plane from reflection point 24 parallel to reflector axis 20.

If feedhorn 12 was located at focal point 18, rays **22*a–d* would also reflect from reflector 10 as rays 23*a–d* parallel to wavefront center line 31**, and the resulting reflected beam would produce planar waves. The use of such waves for far-zone testing is known in the art.

However, when feedhorn 12 is positioned away from focal point 18, as in the invention, only the center ray of the beam along feed line 30 is reflected parallel to the reflector axis. The surrounding rays of the beam, shown as **22*a–d*, are reflected as diverging rays 23*a–d*, as shown in FIG. 1. The resulting reflected rays now produce the spherical waves that appear to be emanating from virtual point source 44. These waves may be used for near-zone measurements of any test object placed within a measurement volume 14 bounded by wave fronts 40 and 42**.

To the object under test in measurement volume 14, the rays **23*a–d* in FIG. 1 and rays 31*a,b* in FIG. 2 appear to be coming from a virtual point source 44 on line 31 behind reflector 10. In the preferred embodiment, means (not shown) are provided for smoothly adjusting the position of feedhorn 12 along feed line 30 to permit convenient regulation of the wavefront radius R. The wavefront radius is equal to the effective radial distance from the center 50 of the measurement volume to a virtual source 44** behind the reflector. The feedhorn displacement A from the focal point along the feed line can be calculated from formula 1 for a desired wavefront radius R.

$$A = \frac{(F + H^2/4F)^2}{R - Z + F + H^2/2F} \qquad \text{formula 1}$$

wherein the symbols A, H, F, R and Z are shown in FIG. 2 and:

A = the feedhorn displacement from the focal point along the feed line;

H = the distance between reflector axis 20 and reflection point 24;

F = the focal length of reflector 10;

R = the wavefront radius, the effective radius of the spherical wave from virtual point source 44 to the center 50 of measurement volume 14; and Z = the distance along reflector axis 20 between a projection of center 50 of measurement volume 14 and point 21 on reflector 10.

The preferred value of the feed-line offset angle ANG (see FIG. 2) may be calculated with formula 2.

$$\cos(ANG) = \frac{F - H^2/4F}{[H^2 + (F - H^2/4F)^2]^{\frac{1}{2}}} \qquad \text{formula 2}$$

The use of an offset angle other than ANG would yield an astigmatic (diffused or unfocused) source which would degrade wave quality in the measurement volume.

Use of the aforementioned formulas allow a wide range of parametric variations in the utilization of the invention, as the reflector parameters, the measurement volume spacing, and the wavefront radius may all be selected for specific needs. An embodiment of the invention was built with a half-reflector of 12 foot focal length F with rolled edges. Measurement volume center 50 was 6 feet (H) from reflector axis 20, and 24 feet (Z) from reflector center 21. Offset angle ANG was calculated using formula 2 to be 28.07 degrees. Using formula 1, the calculated positions A of feedhorn 12 from focal point 18 for various wavefront radius R are as shown in Table 1.

TABLE 1

| R (feet) | 50 | 100 | 200 | 800 | 3200 |
|---|---|---|---|---|---|
| A (inches) | 49.39 | 21.80 | 10.29 | 2.47 | .061 |

Actual measurements using frequencies at 10 and 35 GHz were in good agreement with theoretical calculations for near-zone measurements for targets consisting of long, fat, conducting cylinders. A measurement volume 6′ high, 9′ wide and 12′ deep is expected to provide high quality measurements from 6 to 100 GHz. Larger measurement volume or the use of lower frequencies is readily achieved with a larger reflector.

In summary, numerous benefits have been described which result from employing the principles of the invention. With the invention, a variable-zone compact range is provided wherein the waves in the measurement volume are variable from spherical waves of about 50′ radius to planer waves of infinite radius. By employing the principles of the invention, the feedhorn is moved in a straight line path along the feed line, thereby providing a system which can be digitally controlled with high accuracy and precision. With the invention, a compact range is provided that does not produce astigmatic waves in the measurement volume, and diffraction effects from the reflector rim are suppressed.

The foregoing description of the invention has been presented for purposes of illustration and description. It is not intended to be exhaustive or to limit the invention to the precise form disclosed. Obvious modifications or variations are possible in light of the above teachings. For example, less than or more than half a parabolic reflector could be used. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

We claim:

1. A compact range apparatus comprising:

a parabolic reflector having a focal point lying on a reflector axis extending to a central point of intersection with said reflector and a feed line extending from said focal point to a reflection point on said reflector, said feed line being angularly offset from said reflector axis; and source means, located on said feed line, for directing divergent primary waves towards said reflector, said primary waves reflecting symmetrically about a reflected beam center line extending parallel to said reflector axis through the reflection point, said primary waves obeying the laws of geometrical optics with respect to said reflector;

a measurement volume, for containing a device under test, being illuminated by the reflected waves, said reflected waves being spherical waves, the radius of said spherical waves being a function of the distance from said source to said reflector.

2. The compact range apparatus of claim 1 wherein said measurement volume is symmetrically disposed about said reflected beam center line.

3. The compact range apparatus of claim 1 wherein said primary waves are symmetrically disposed about said feed line.

4. The compact range apparatus of claim 1 wherein the location of said source means along said feed line is adjustable to correspondingly vary the radius of curvature of the spherical waves in said measurement volume.

5. The compact range apparatus of claim 1 wherein said reflector consists of a portion of a parabolic reflector disposed symmetrically about a first plane containing said feed line and said reflector axis, a bottom rim of said reflector being parallel to a second plane containing said reflector axis and perpendicular to said first plane, an outer rim of said reflector forming a semicircle in a third plane perpendicular to said first and second planes.

6. The compact range apparatus of claim 5 wherein said reflector rims are rolled to minimize wave diffractions.

7. The compact range apparatus of claim 5 wherein the distance from said source to the focal point A is determined by the formula:

$$A = \frac{(F + H^2/4F)^2}{R - Z + F + H^2/2F}$$

wherein:

H = the distance between the reflector axis and the reflection point;

F = the focal length of said reflector;

R = the radius of the desired spherical waves; and

Z = the distance along the reflector axis between said reflector and a projection of the center of the measurement volume.

8. The compact range apparatus of claim 7 wherein the feed-line offset angle ANG is determined by the formula:

$$\cos(ANG) = \frac{F - H^2/4F}{[H^2 + (F - H^2/4F)^2]^{\frac{1}{2}}}$$

9. The compact range apparatus of claim 1 wherein said source means comprises a feedhorn surrounded by absorbers to reduce aperture-blockage effects.

10. The compact range apparatus of claim 1 further comprising anechoic chamber means for shielding said parabolic reflector, source, and measurement volume from outside radiation.

* * * * *